United States Patent [19]
Hara

[11] Patent Number: 5,459,354
[45] Date of Patent: Oct. 17, 1995

[54] SEMICONDUCTOR DEVICE WITH IMPROVED INSULATION OF WIRING STRUCTURE FROM A GATE ELECTRODE

[75] Inventor: Tatsuya Hara, Tokyo, Japan

[73] Assignee: Nippon Steel Corporation, Tokyo, Japan

[21] Appl. No.: 169,130

[22] Filed: Dec. 20, 1993

[30] Foreign Application Priority Data

Dec. 25, 1992 [JP] Japan ................................. 4-358334

[51] Int. Cl.⁶ .................... H01L 23/48; H01L 29/46; H01L 29/54; H01L 29/62
[52] U.S. Cl. .................... 257/754; 257/383; 257/384; 257/755; 257/758
[58] Field of Search .................... 257/368, 383, 257/384, 754, 755, 758, 734

[56] References Cited

U.S. PATENT DOCUMENTS

| | | | |
|---|---|---|---|
| 4,744,861 | 5/1988 | Matsunaga et al. | 257/754 |
| 4,782,037 | 11/1988 | Tomozawa et al. | 257/755 |
| 5,043,790 | 8/1991 | Butler | 257/383 |
| 5,045,916 | 9/1991 | Vor et al. | 257/384 |

FOREIGN PATENT DOCUMENTS 4-330768  2/1991  Japan .

OTHER PUBLICATIONS

S. M. Sze, Semiconductor Devices Physics and Technology, 1985, pp. 455–456.

Primary Examiner—Rolf Hille
Assistant Examiner—David Ostrowski
Attorney, Agent, or Firm—Pollock, Vande Sande & Priddy

[57] ABSTRACT

A semiconductor device comprises a silicon substrate, a gate electrode including a conductive layer formed on the silicon substrate with a gate insulating film disposed between the conductive layer and the silicon substrate and a first insulating layer covering the conductive layer, a conductive region formed in the surface of the silicon substrate at its portion adjacent to the gate electrode, a second insulating layer formed so as to cover the gate electrode and the silicon substrate, a third insulating layer formed so as to cover the second insulating layer, a contact hole formed by etching to penetrate the third and second insulating layers and to reach the conductive region, and a wiring layer formed to cover the third insulating layer and having a contact part extending inside the contact hole, and electrically connect to the conductive region, the second insulating layer being made of a material having a selected ratio of an etching rate relative to an etching rate of a material of the first insulating layer in formation of the contact hole by etching, and sections of the third and second insulating layers exposed to an inner side of the contact hole being flush along the inner side.

6 Claims, 2 Drawing Sheets

SEMICONDUCTOR DEVICE WITH IMPROVED INSULATION OF WIRING STRUCTURE FROM A GATE ELECTRODE

BACKGROUND OF THE INVENTION

1. Field of the Invention

The present invention relates to a wiring structure in a semiconductor device and to a method of making the same and, more particularly, to a wiring structure in a semiconductor device having a gate electrode and a conductive region adjacent to the gate electrode for connecting a wiring layer formed on an upper portion of the semiconductor device and the conductive region and a method of making the same.

2. Description of the Related Art

FIG. 2 of the accompanying drawings shows a conventional wiring structure in a semiconductor device having a gate electrode formed on a silicon substrate, a wiring layer formed on the gate electrode with an insulating film between them and a contact hole through which the wiring layer is connected to the gate electrode. As shown in FIG. 2, a metal layer 22 is formed on an upper surface of a silicon substrate 21 at its predetermined position with a gate insulating film 32 disposed therebetween, and a silicon dioxide film layer 23 is laminated on the upper surface of the metal layer 22 as an insulating layer. A side wall 24 made of a silicon dioxide film is formed so as to cover each of side surfaces (left and right side surfaces in FIG. 2) of a lamination of the metal layer 22 and the silicon dioxide film layer 23 forming a gate electrode 25. Source-drain diffusion regions 30 are formed on the silicon substrate 21 at both sides of its portion on which the metal layer 22 of the gate electrode 25 is formed.

A silicon dioxide film layer 26 is formed so as to cover the upper surface of the silicon substrate 21 and the gate electrode 25. A contact hole 27 is formed by removing a part of the silicon dioxide film layer 26 by a photo-lithography technique. A wiring layer 28 is laminated so as to cover the inner surface of the contact hole 27 and the upper surface of the silicon dioxide film layer 26, and a contact part 29 is formed in the contact hole 27 for connection between the wiring layer 28 and the source-drain diffusion region 30.

However, as the size of the semiconductor device becomes greatly smaller, a spacing between the gate electrode 25 and the contact part 29 may be reduced so that the contact part 29 and the gate electrode 25 overlap with each other as shown in FIG. 2. Such structure involves a problem in that when the silicon dioxide film layer 26 is removed in order to form the contact hole 27, the gate electrode 25 may be exposed and the silicon dioxide film layer 23 may be partly removed, resulting in a short-circuit between the gate electrode 25 and the contact part 29 of the wiring layer 28.

SUMMARY OF THE INVENTION

An object of the present invention is to provide a wiring structure, in a semiconductor device having a gate electrode, a conductive region formed adjacent to the gate electrode, and a wiring layer formed above the gate electrode and connected through a contact hole with the conductive region, which is capable of preventing a short-circuit between the gate electrode and a contact part of the wiring layer formed inside the contact hole thereby improving the reliability of the semiconductor device.

To achieve the above object, a semiconductor device according to the present invention comprises a silicon substrate, a gate electrode including a conductive layer formed on a silicon substrate with a gate insulating film therebetween and a first insulating layer covering the conductive layer. A conductive region is formed in the silicon substrate at its portion adjacent to the gate electrode, and a second insulating layer is formed so as to cover the gate electrode and the silicon substrate. A third insulating layer is formed so as to cover the second insulating layer, a contact hole is formed to penetrate the third and second insulating layers and reach the conductive region, and a wiring layer is formed so as to cover the third insulating layer. The wiring layer has a contact part extending inside of the contact hole so as to be electrically connected to the conductive region. The second insulating layer is made of a material selected to make controllable a ratio of an etching rate of the second insulating layer relative to an etching rate of the first insulating layer during an etching process for formation of the contact hole.

A method of making a wiring structure in a semiconductor device according to the present invention comprises the steps of forming a gate electrode by forming a gate insulating film, a conductive layer and a first insulating layer, in that order, on a silicon substrate, and forming an impurity diffusion region in the silicon substrate at its portion adjacent to the gate electrode. A second insulating layer is then formed to cover the gate electrode and the silicon substrate, and a third insulating layer on the second insulating layer. A contact hole is made by etching to penetrate the third and second insulating layers and to reach the impurity diffusion region, and a wiring layer made of a conductive material is formed on the third insulating layer. A contact part of the wiring layer extends inside the contact hole and electrically connects to the impurity diffusion region. The second insulating layer is made of a material selected so as to make controllable a ratio of an etching rate of the second insulating layer relative to an etching rate of the first insulating layer in the step of forming the contact hole by etching.

With the wiring structure in a semiconductor device according to the present invention, the material of the second insulating layer is selected such that, when the third and second insulating layers are etched in formation of the contact hole, it is possible to make the etching rate of the second insulating layer sufficiently larger than that of the first insulating layer. Thus, the first insulating layer can be prevented from being removed by etching, thereby a short-circuiting between the contact part of the wiring layer and the conductive layer of the gate electrode is prevented.

BRIEF DESCRIPTION OF THE DRAWINGS

FIGS. 1A through 1G are schematic cross-sectional side views used to explain the process of making a wiring structure in a semiconductor device according to an embodiment of the present invention.

DESCRIPTION OF THE PREFERRED EMBODIMENTS

A method of making a wiring structure in a semiconductor device according to an embodiment of the present invention will be described below with reference to FIGS. 1A through 1G.

Figure 1A:
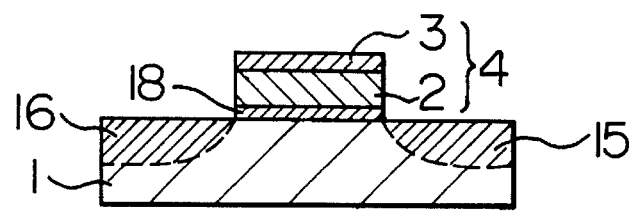
Figure 1B:
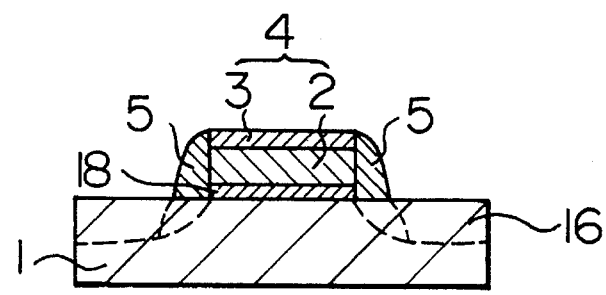

As shown in FIG. 1A, a metal layer 2 is formed on an upper surface of a silicon substrate 1 at its predetermined position with a gate insulating film 18 disposed between the semiconductor substrate 1 and the metal layer 2, and a silicon dioxide film layer 3 is formed on the metal layer 2, thereby forming a gate electrode 4 made of two-layer lamination of the metal layer 2 and the silicon dioxide film layer 3. Then, diffusion regions 16 are formed by diffusing impurities at low concentration into parts 15 which serve as source and drain regions of a transistor by using the gate electrode 4 as a mask. As shown in FIG. 1B, side wall layers 5 are provided that cover side surfaces of the lamination of the metal layer 2 and the silicon dioxide film layer 3 (left and right side surfaces in FIG. 1B) by etching the silicon dioxide film by an anisotropic etching process. An electrically conductive layer such as a polysilicon film containing impurities may be used in place of the metal layer 2.

Figure 1C:
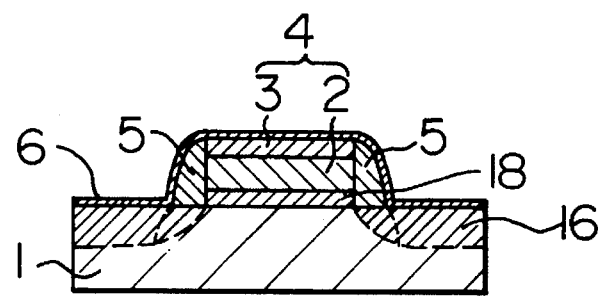

Further, as shown in FIG. 1C, a silicon nitride film layer 6 is formed on the diffusion region 16 so as to cover the upper surface of the silicon substrate 1 and the gate electrode 4. After the silicon nitride film layer 6 is formed, impurities such as P, B, BF$_2$, As are introduced into the silicon substrate by an ion-implantation technique to form source-drain regions 16. In this case, by using the silicon nitride film layer 6 having a thickness in a range of from 50 nm to 500 nm, the silicon nitride film layer 6 can be used as a so-called through-film for preventing a damage at ion implantation. Thereafter, the assembly is annealed or capacitance (capacitor) or the like is formed. Japanese Patent Publication JP-A-4-330768 published on Nov. 18, 1992 discloses a silicon nitride film formed on a gate electrode, which is used as etching stopper in etching an anti-reflection film in a semiconductor device.

Figure 1D:
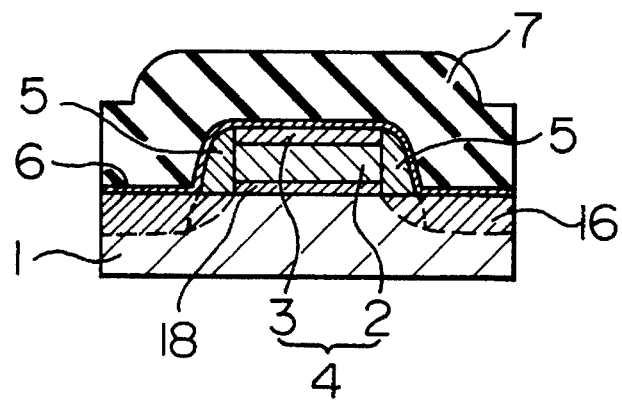
Figure 2:
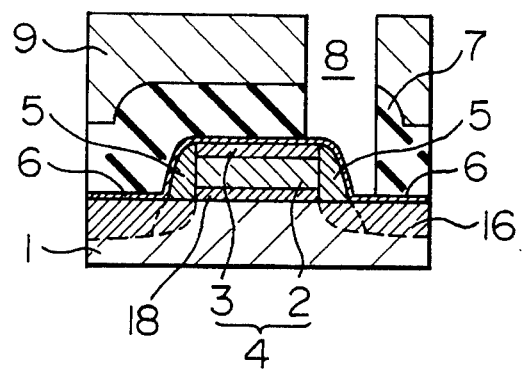
FIG. 2 is a schematic cross-sectional side view showing a conventional wiring structure of a semiconductor device.
Figure 2:
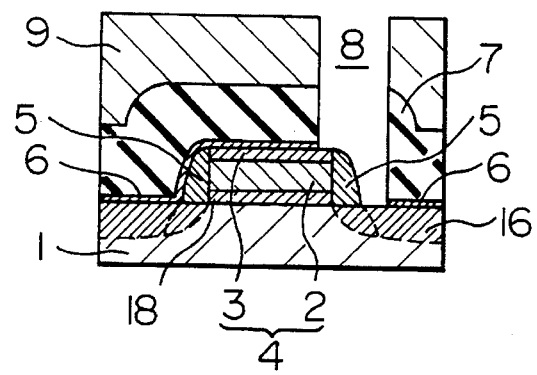
Figure 2:
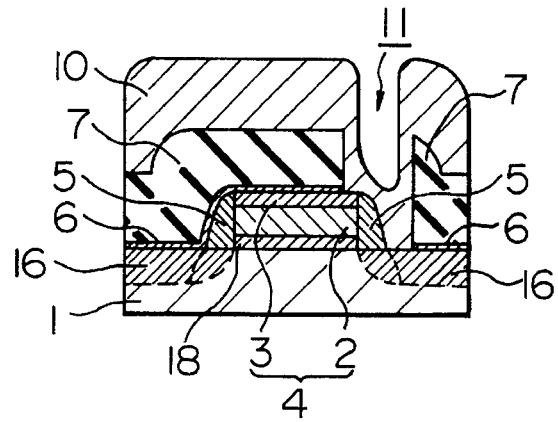
Figure 2:
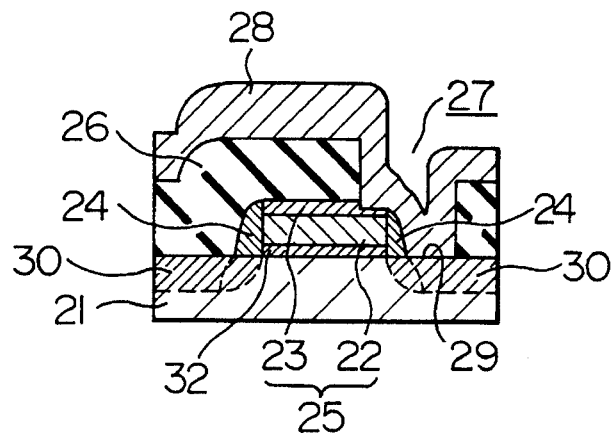

Subsequently, as shown in FIG. 1D, an insulating film 7 is formed on the upper surface of the silicon nitride film layer 6. The insulating film 7 is formed of a silicon dioxide film formed under low or normal pressure or a silicon dioxide film into which phosphor (P) or boron (B) is introduced for smoothing its surface.

As shown in FIG. 1E, the insulating film 7 is covered at its selected position with a photoresist 9 and a part of the insulating film 7 is removed by the photolithography. At that time, even when a spacing between the gate electrode 4 and the contact hole 8 is reduced so that the gate electrode 4 and the contact hole 8 overlap each other as shown in FIG. 1E, as the size of the semiconductor device is made greatly smaller, the insulating film 7 can be removed satisfactorily without etching the silicon dioxide film layer 3 and the side wall layer 5 by making a selection ratio of the silicon oxide film relative to the silicon nitride film layer 6 exposed to the bottom surface of the contact hole 8 as shown in FIG. 1E, i.e. a ratio of the etching rate of the silicon dioxide film to the etching rate of the silicon nitride film higher than 1.5 by using CHF$_3$ gas, as etchant.

Subsequently, the exposed silicon nitride film layer 6 is removed similarly. At that time, the silicon nitride film layer 6 can be removed satisfactorily without etching the silicon dioxide film layer 3 and the side wall layer 5 by making a selection ratio of the silicon nitride film layer 6 relative to the silicon dioxide film of which both of the side wall layer 5 and the layer 3 are formed, i.e. a ratio of the etching rate of the silicon nitride film layer 5 to the etching rate of the silicon dioxide film layer forming the side wall layer larger than 1.5 by using a wet etching process using phosphoric acid or gas etching using CF$_4$ gas or the like. When the contact hole 8 is formed as described above, and as shown in FIG. 1F, the silicon dioxide film layer 3 and the side wall layer 5 serving for insulating the gate electrode 4 can be prevented from being removed.

After the contact hole 8 is formed, as shown in FIG. 1G, a wiring layer 10 is laminated so as to cover the inner surface of the contact hole 8 and the upper surface of the insulating film 7, and the wiring layer 10 extends inside the contact hole 8 to thereby form a contact part 11 which is in contact with the source-drain region 16. At that time, even when the contact part 11 and the gate electrode 4 partly overlap each other, the silicon dioxide film layer 3 and the side wall layer 5 sufficiently remain around the metal layer 2 of the gate electrode 4 as the insulating film. There is then no problem that a short-circuit occurs between the gate electrode 4 and the contact part 11.

As described above, according to the present invention, the insulating film including a silicon dioxide film layer covering the metal layer of the gate electrode and a silicon dioxide film of the side wall layer is covered with an additional silicon dioxide film with an intermediate silicon nitride film disposed therebetween. Thus, even when the gate electrode and the contact hole partly overlap each other, as the size of the semiconductor device becomes greatly smaller, the insulating film can be prevented from being removed when the contact hole is formed by etching. Therefore, the wiring structure of the present invention ensures a high insulating property and high reliability. Also, a high margin can be obtained in design of the contact hole.

I claim:

1. A wiring structure in a semiconductor device comprising:

a silicon substrate;

a gate electrode including a conductive layer formed on said silicon substrate with a gate insulating film disposed between the conductive layer and the silicon substrate and a first insulating layer covering said conductive layer;

a conductive region formed in the surface of said silicon substrate at its portion adjacent to said gate electrode;

a second insulating layer formed so as to cover said gate electrode and said silicon substrate;

a third insulating layer formed to cover said second insulating layer;

a contact hole formed by etching to penetrate said third and second insulating layers and to reach said conductive region; and a wiring layer formed to cover said third insulating layer and having a contact part extending inside said contact hole, and electrically connected to said conductive region, wherein said second insulating layer is made of a material having a selected ratio of an etching rate relative to an etching rate of a material of said first insulating layer in formation of said contact hole by etching and wherein sections of said third and second insulating layers exposed to an inner side of the contact hole are flush along said inner side.

2. A wiring structure as claimed in claim 1, wherein said first insulating layer includes an insulating layer formed on said conductive layer and a side wall formed on a side surface of said conductive layer.

3. A wiring structure as claimed in claim 1, wherein the etching rate of the second insulating film is higher than the etching rate of the first insulating film in the etching for formation of said contact hole.

4. A wiring structure as claimed in claim 1, wherein said second insulating layer is made of a material so as to make a ratio of an etching rate of said second insulating layer relative to an etching rate of said first insulating material at the etching in formation of said contact hole higher than 1.5.

5. A wiring structure as claimed in claim 1, wherein said first insulating film is a silicon dioxide film, and said second insulating film is a silicon nitride film.

6. A wiring structure in a semiconductor device comprising:

a silicon substrate;

a gate electrode including a conductive layer formed on said silicon substrate with a gate insulating film disposed between the conductive layer and the silicon substrate and a first insulating layer covering said conductive layer;

a conductive region formed in the surface of said silicon substrate at its portion adjacent to said gate electrode;

a second insulating layer formed so as to cover said gate electrode and said silicon substrate;

a third insulating layer formed so as to cover said second insulating layer;

a contact hole formed by etching to extend through said third and second insulating layers and to reach said conductive region; and a wiring layer formed to cover said third insulating layer, extend inside said contact hole, and electrically connect to said conductive region, wherein said second insulating layer is made of a material having a ratio of an etching rate selected relative to an etching rate of a material of said first insulating layer such that in formation of said contact hole by etching said first insulating layer is prevented from being removed by etching while said second insulating layer is completely removed at the bottom portion of said contact hole and wherein said second and third insulating layers have their portions facing said contact hole aligned with each other.

* * * * *